(12) United States Patent
Paik et al.

(10) Patent No.: US 7,741,143 B2
(45) Date of Patent: Jun. 22, 2010

(54) IMAGE SENSOR HAVING 3-DIMENSIONAL TRANSFER TRANSISTOR AND ITS METHOD OF MANUFACTURE

(75) Inventors: Kee-Hyun Paik, Jeollabuk-do (KR); Jeong-Ho Lyu, Gyeonggi-do (KR); Chang-Sub Lee, Gyeonggi-do (KR); Keun-Ho Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 671 days.

(21) Appl. No.: 11/325,975

(22) Filed: Jan. 4, 2006

(65) Prior Publication Data
US 2006/0145215 A1  Jul. 6, 2006

(30) Foreign Application Priority Data
Jan. 6, 2005  (KR)  ............... 10-2005-0001338

(51) Int. Cl.
*H01L 31/103* (2006.01)
(52) U.S. Cl. ............... 438/57; 257/292; 257/E27.132; 257/E31.103
(58) Field of Classification Search ......... 257/291–293, 257/E27.13, E27.131–E27.133, E31.103; 438/48, 57, 73
See application file for complete search history.

(56) References Cited

U.S. PATENT DOCUMENTS 4,760,273 A * 7/1988 Kimata ............... 250/208.1
6,979,587 B2 * 12/2005 Lee ..................... 438/57
2003/0020002 A1 * 1/2003 Lee ..................... 250/208.1
2003/0127666 A1 * 7/2003 Lee ..................... 257/225
2003/0173585 A1  9/2003 Kimura et al.
2003/0227039 A1 * 12/2003 Umeda et al. ......... 257/291
2006/0081887 A1 * 4/2006 Lyu .................... 257/215

FOREIGN PATENT DOCUMENTS

| JP | 2000-353801 | 12/2000 |
| JP | 2003-289137 | 10/2003 |
| JP | 2004-039671 | 2/2004 |

OTHER PUBLICATIONS

English language abstract of Korean Publication No. 2000-353801.
English language abstract of Japanese Publication No. 2003-289137.
English language abstract of Japanese Publication No. 2004-039671.

* cited by examiner

*Primary Examiner*—Lynne A Gurley
*Assistant Examiner*—Colleen A Matthews
(74) *Attorney, Agent, or Firm*—Volentine & Whitt, PLLC

(57) ABSTRACT

In an embodiment, an image sensor includes an isolation layer disposed in a semiconductor substrate to define a first active region and a second active region extending from the first active region. A photodiode is disposed in a portion of the first active region. A floating diffusion region is provided in the second active region at a position spaced apart from the photodiode. A transfer gate electrode is disposed on the second active region between the photodiode and the floating diffusion region. The transfer gate electrode is disposed to cover both sidewalls and an upper portion of the second active region. The transfer gate electrode has a region extending onto the first active region and overlapping the photodiode. The photodiode has a protrusion into the second active region at the portion adjacent to the transfer gate electrode. A deep n-impurity region of the photodiode extends in the protrusion.

13 Claims, 11 Drawing Sheets

IMAGE SENSOR HAVING 3-DIMENSIONAL TRANSFER TRANSISTOR AND ITS METHOD OF MANUFACTURE

CROSS-REFERENCE TO RELATED APPLICATION

This application claims priority from Korean Patent Application No. 2005-1338, filed Jan. 6, 2005, the disclosure of which is incorporated by reference in its entirety as if set forth fully herein.

BACKGROUND OF INVENTION

1. Technical Field

The present invention relates to an image sensor and a method of its manufacture, and more particularly, to an image sensor having a 3-dimensional transfer transistor and a method of its manufacture.

2. Discussion of the Related Art

An image sensor is a semiconductor device that converts an optical image into an electric signal. The image sensor can be classified into either a charge coupled device (CCD) type or a complementary metal oxide semiconductor (CMOS) type. The CMOS type image sensor will be referred to as CIS (CMOS image sensor). The CIS includes a plurality of 2-dimensional pixels. The pixels each employ a photodiode (PD), a floating diffusion region (FD), and a transfer transistor (TX). The photodiode PD serves to convert incident light into an electric signal. The transfer transistor TX serves to transfer photocharges collected at the photodiode PD to the floating diffusion region FD. If the photocharges collected at the photodiode PD are not completely transferred to the floating diffusion region FD, there may occur a problem of a degraded display resolution by a phenomenon called an image lag. Thus, it is important that the transfer transistor TX sufficiently transfer the photocharges collected at the photodiode PD to the floating diffusion region FD.

A method of manufacturing such an image sensor has been disclosed in U.S. Patent Publication No. 2003/0173585 A1, Kimura, et al., "Semiconductor device having solid-state image sensor with suppressed variation in impurity concentration distribution within semiconductor substrate and method of manufacturing the same."

FIG. 1 is a cross-sectional view of a pixel portion of the image sensor disclosed in U.S. Patent Publication No. 2003/0173585 A1.

Referring to FIG. 1, a P-well 11 is formed on the semiconductor substrate 10 at a certain depth. An isolation layer 12 is formed to define an active region. A transfer gate structure 15 is disposed across on the active region. The transfer gate structure 15 includes a gate dielectric 13 and a transfer gate electrode 14 on top. A photodiode 18 is disposed in the P well 11 at one side of the transfer gate structure 15. The photodiode 18 has a P-type impurity region 16 and an N-type impurity region 17. A floating diffusion region 19 is disposed in the P well 11 at the other side of the transfer gate structure 15.

For a high integration of the image sensor, the sizes of the photodiode 18 and the transfer gate structure 15 should be reduced as much as possible. However, a drivability of the transfer transistor TX is determined by the length and width of its effective channel. The width of the effective channel is defined by the transfer gate structure 15. That is, for securing the drivability, it is advantageous to enlarge the width of the effective channel defined by the transfer gate structure 15. However, in the publication by Kimura, et al., the transfer gate structure 15 is disposed on the plane on the semiconductor substrate 10. Accordingly, there is a trade-off between the drivability and the reduction of the size of the transfer structure 15.

Using a 3-dimensinal structure transfer transistor may be a solution of the above problem, as we now discuss.

FIG. 2 is a plan view illustrating a part of a pixel portion of an image sensor having a conventional 3-dimensional (3-D) transfer transistor, and FIG. 3 is a cross-sectional view taken along line I-I' of FIG. 2.

Referring to FIGS. 2 and 3, the image sensor having the conventional 3-D transfer transistor includes, at a certain area of a semiconductor substrate 21, an isolation layer 23 defining a first active region 1 and a second active region 2. The second active region 2 is configured to extend from the first active region 1. A shallow p-impurity region 27 is in a portion of the first active region 1. A deep n-impurity region 25 is below the shallow p-impurity region 27. The shallow p-impurity region 27 and the deep n-impurity region 25 define a photodiode (PD) 29. A floating diffusion region (FD) 39 is in the second active region 2 at a position spaced apart from the photodiode 29. The floating diffusion region 39 is a high concentration n-impurity region. A transfer gate electrode 33 is disposed on the second active region 2 between the photodiode 29 and the floating diffusion region 39. The transfer gate electrode 33 is so disposed across the second active region 2 as to cover the sidewalls 37 of the second active region 2.

The transfer gate electrode 33 has a region that extends onto the first active region 1 and overlap the photodiode 29. In this case, a spaced region d is formed between the sidewalls 37 of the second active region 2 and the photodiode 29. Also, a gate dielectric 31 is interposed between the transfer gate electrode 33 and the active regions 1 and 2. The gate dielectric 31 may further extend to cover the photodiode 29 and the floating diffusion region 39. The deep n-impurity region 25, the transfer gate electrode 33 and the floating diffusion region 39 constitute a transfer transistor TX. In this case, the width of an effective channel of the transfer transistor TX is determined by the upper portion 35 and sidewalls 37 of the second active region 2. That is, the width of the effective channel is enlarged to the extent of a length of the sidewalls 37 of the second active region 2 covered by the transfer gate electrode 33.

If incident light is radiated onto the photodiode 29, the photocharges are concentrated in the deep n-impurity region 25. The quantity of the photocharges concentrated in the deep n-impurity region 25 is determined by the intensity of incident light. Subsequently, when a gate voltage higher than the threshold voltage is applied to the transfer gate electrode 33, an inversion region is formed at the upper portion 35 and sidewalls 37 in the active regions 1 and 2 covered with the transfer gate electrode 33, and the photocharges concentrated in the deep n-impurity region 25 are transferred to the floating diffusion region 39 via the inversion region.

However, if the spaced region d exists, the photocharges concentrated in the deep n-impurity region 25 have difficulty moving toward the sidewalls 37 of the second active region 2. That is, the transfer efficiency of the photocharges is degraded.

SUMMARY

Therefore, embodiments of the present invention are directed to providing an image sensor having a 3-dimensional (3-D) transfer transistor capable of improving the transfer efficiency of photocharges, to solve the above-stated problem.

According to some embodiments of the present invention provide methods of manufacturing an image sensor having a 3-D transfer transistor capable of improving the transfer efficiency of photocharges.

In an embodiment, an image sensor includes an isolation layer disposed in a semiconductor substrate to define a first active region and a second active region extending from the first active region. A photodiode is disposed in a portion of the first active region. A floating diffusion region is provided in the second active region at a position spaced apart from the photodiode. A transfer gate electrode is disposed on the second active region between the photodiode and the floating diffusion region. The transfer gate electrode is disposed to cover both sidewalls and an upper portion of the second active region. The transfer gate electrode has a region extending onto the first active region and overlapping the photodiode. The photodiode has a protrusion into the second active region at the portion adjacent to the transfer gate electrode. A deep n-impurity region of the photodiode extends in the protrusion.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
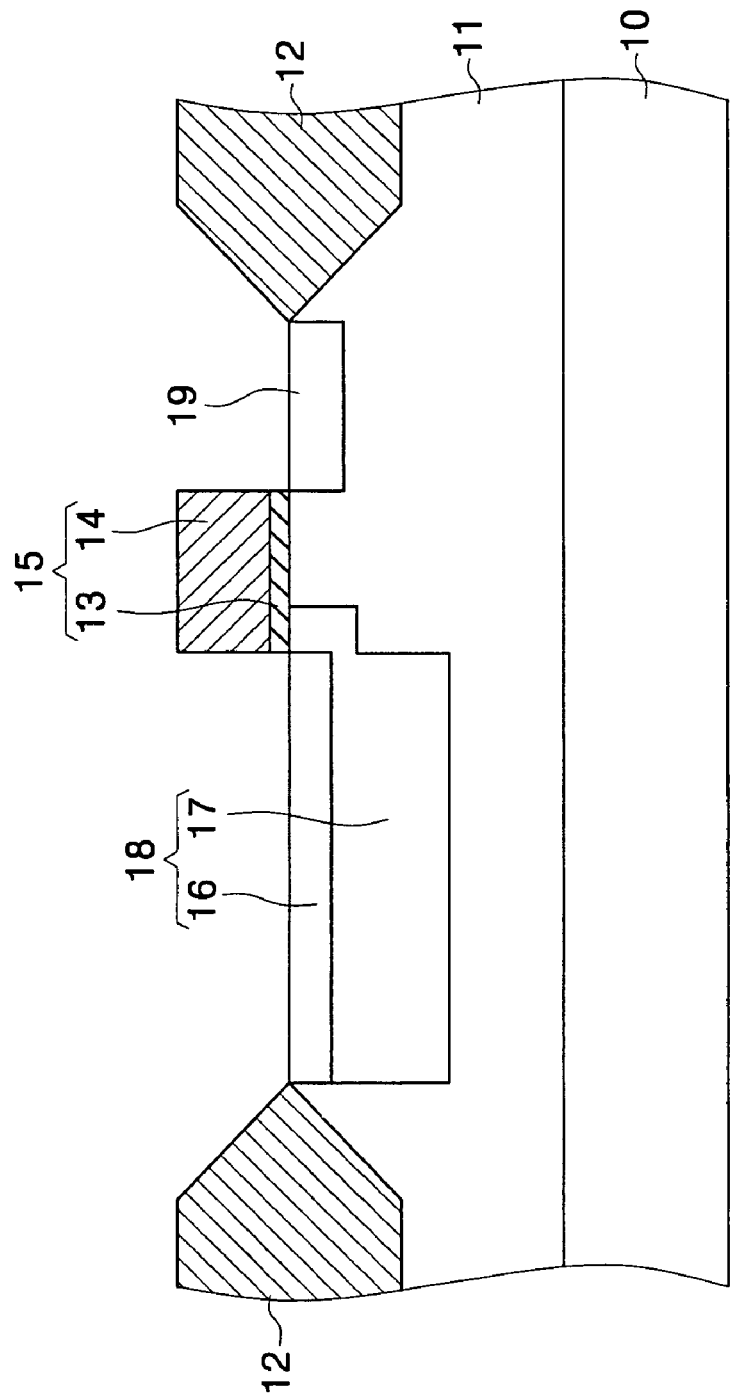
FIG. 1 is a cross-sectional view illustrating a part of a conventional image sensor.
Figure 2:
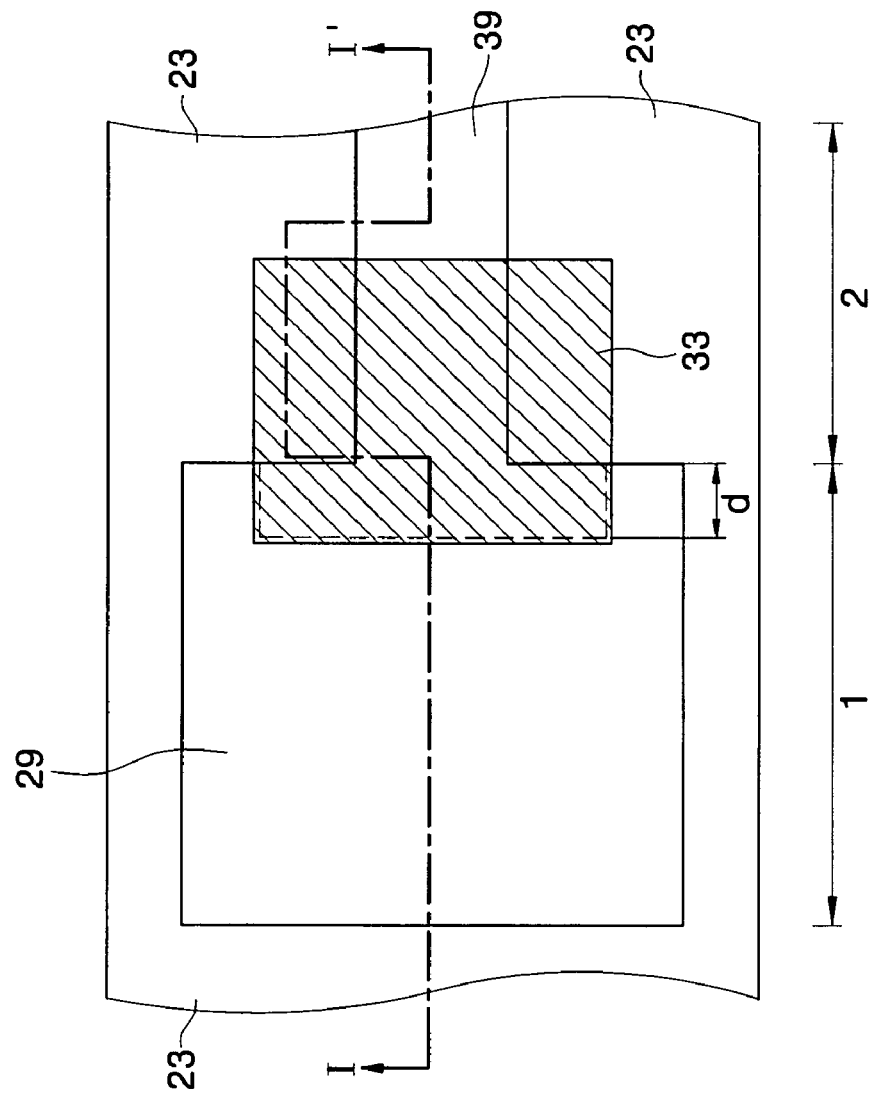
FIG. 2 is a plan view illustrating a part of pixel of a conventional image sensor having a conventional 3-dimensional (3-D) transfer transistor.
Figure 3:
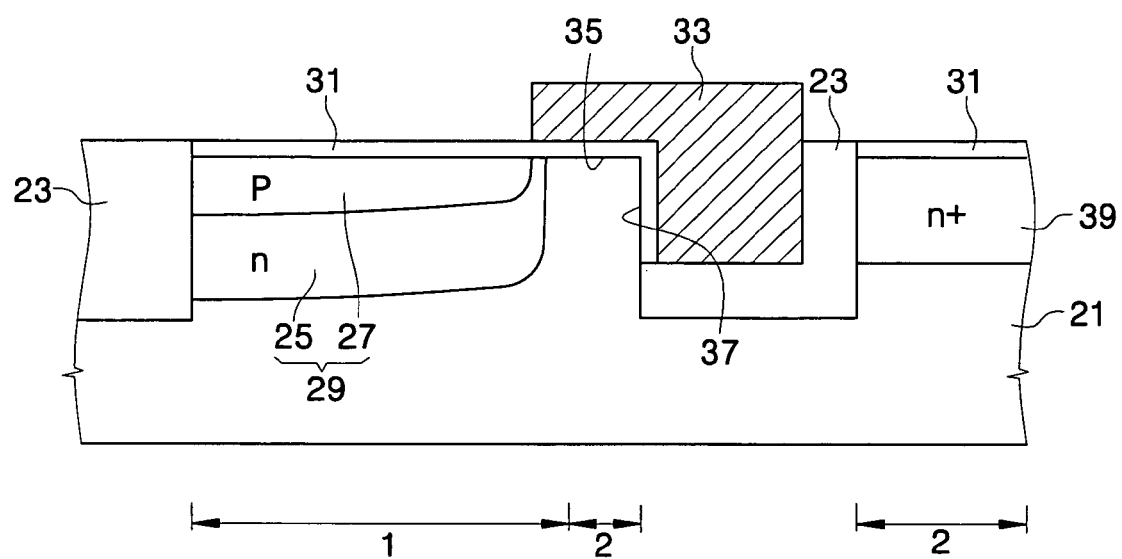
FIG. 3 is a cross-sectional view taken along line I-I' of FIG. 2.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions may be depicted exaggerated to clarify the invention. In addition, if referring that a layer is "on" another layer or substrate, it means that the layer can be directly formed on another layer or substrate, or otherwise, another layer can be interposed. Like numbers refer to like elements throughout the specification.

Figure 4:
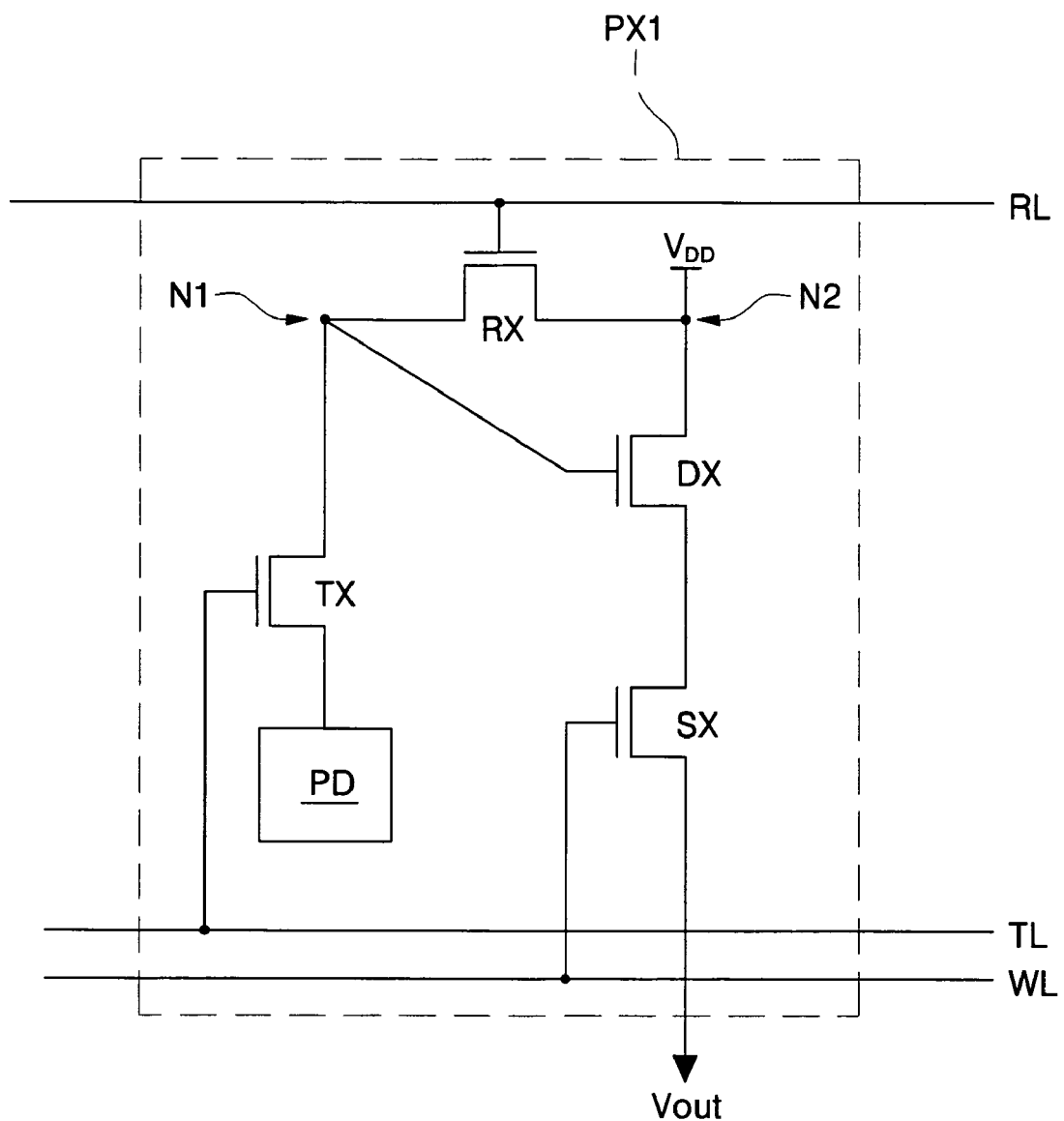
FIG. 4 is an equivalent circuit diagram illustrating a unit pixel of an image sensor, according to the embodiments of the present invention.

FIG. 4 is an equivalent circuit diagram illustrating a unit pixel PX1 of an image sensor having one photodiode PD and four transistors.

Referring to FIG. 4, the unit pixel PX1 of the image sensor includes a photodiode PD having a p-impurity region and an n-impurity region. In addition, the unit pixel PX1 includes a transfer transistor TX serially connected with the photodiode PD, a reset transistor RX, a drive transistor DX, and a select transistor SX. A first node N1 between the transfer transistor TX and the reset transistor RX is connected to a gate electrode of the drive transistor DX. The first node N1 functions as a floating diffusion region FD. Also, a second node N2 between the reset transistor RX and the drive transistor DX is connected to a power source VDD. The transfer transistor TX, the reset transistor RX, the drive transistor DX, and the select transistor SX all may be NMOS transistors. In this case, the n-impurity region of the photodiode PD corresponds to a source region of the transfer transistor TX.

The gate electrode of the transfer transistor TX is electrically connected to a transfer line TL, and the gate electrode of the select transistor SX is electrically connected to a word line WL. Further, the gate electrode of the reset transistor RX is electrically connected to a reset line RL.

Now, a method of outputting data of the unit pixel PX1 will be described.

Referring again to FIG. 4, voltage corresponding to logic "1 (high level)" is applied to the reset line RL to thus turn on the reset transistor RX. As a result, charges remaining in the first node N1, i.e., the floating diffusion region FD are completely removed. Thus, the unit pixel PX1 is initialized. Subsequently, the reset transistor RX is turned off. When incident light is radiated onto the photodiode PD of the initialized unit pixel PX1, electrons are generated in the n-impurity region of the photodiode PD.

To generate an output signal corresponding to the incident light, voltage corresponding to logic "1 (high level)" is applied to the transfer line (TL and the word line (WL). As a result, the transfer transistor TX and the select transistor SX are turned on, and the electrons in the n-impurity region of the photodiode PD are transported into the first node N1. Depending on the quantity of electrons transported into the first node N1, the current drivability of the drive transistor DX is determined, and an output voltage (Vout) is produced at the output terminal of the select transistor SX. In this way, output voltage (Vout) of the unit pixel PX1 is determined by the intensity of incident light radiated onto the photodiode PD.

Figure 5:
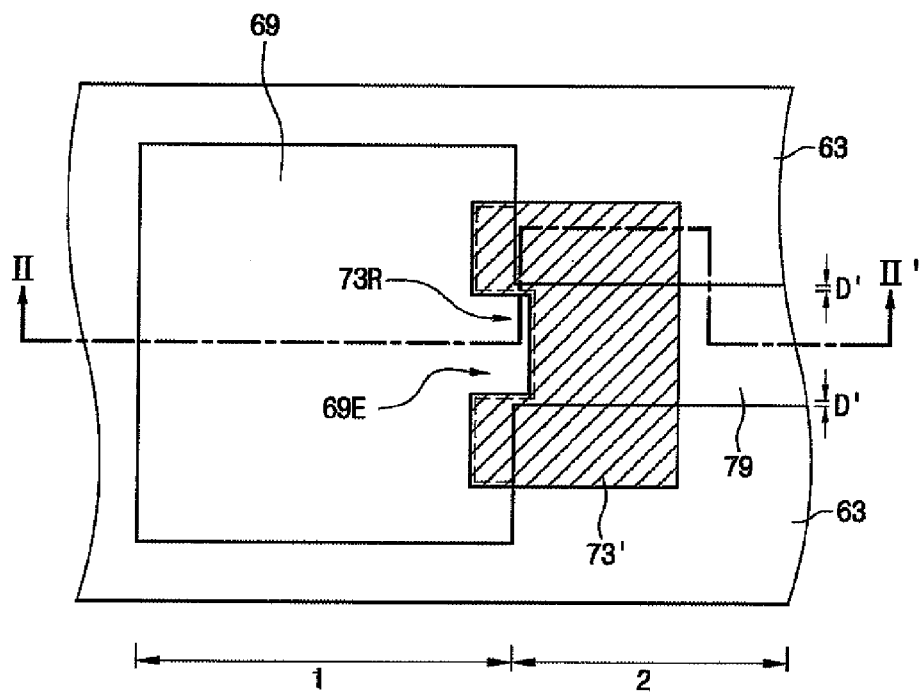
FIG. 5 is a partial plan view illustrating a photodiode, a transfer transistor, and a floating diffusion region in the equivalent circuit diagram of FIG. 4.
Figure 6:
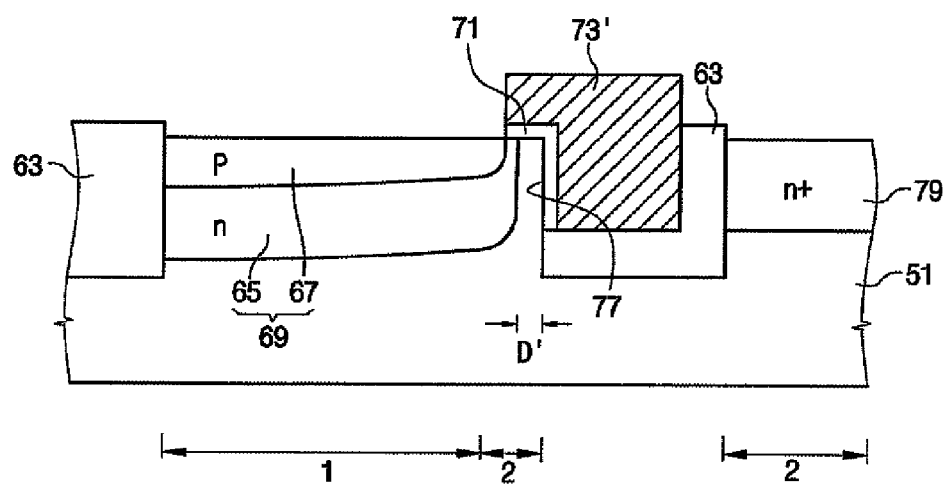
FIG. 6 is a cross-sectional view taken along line II-II' of FIG. 5.
Figure 7:
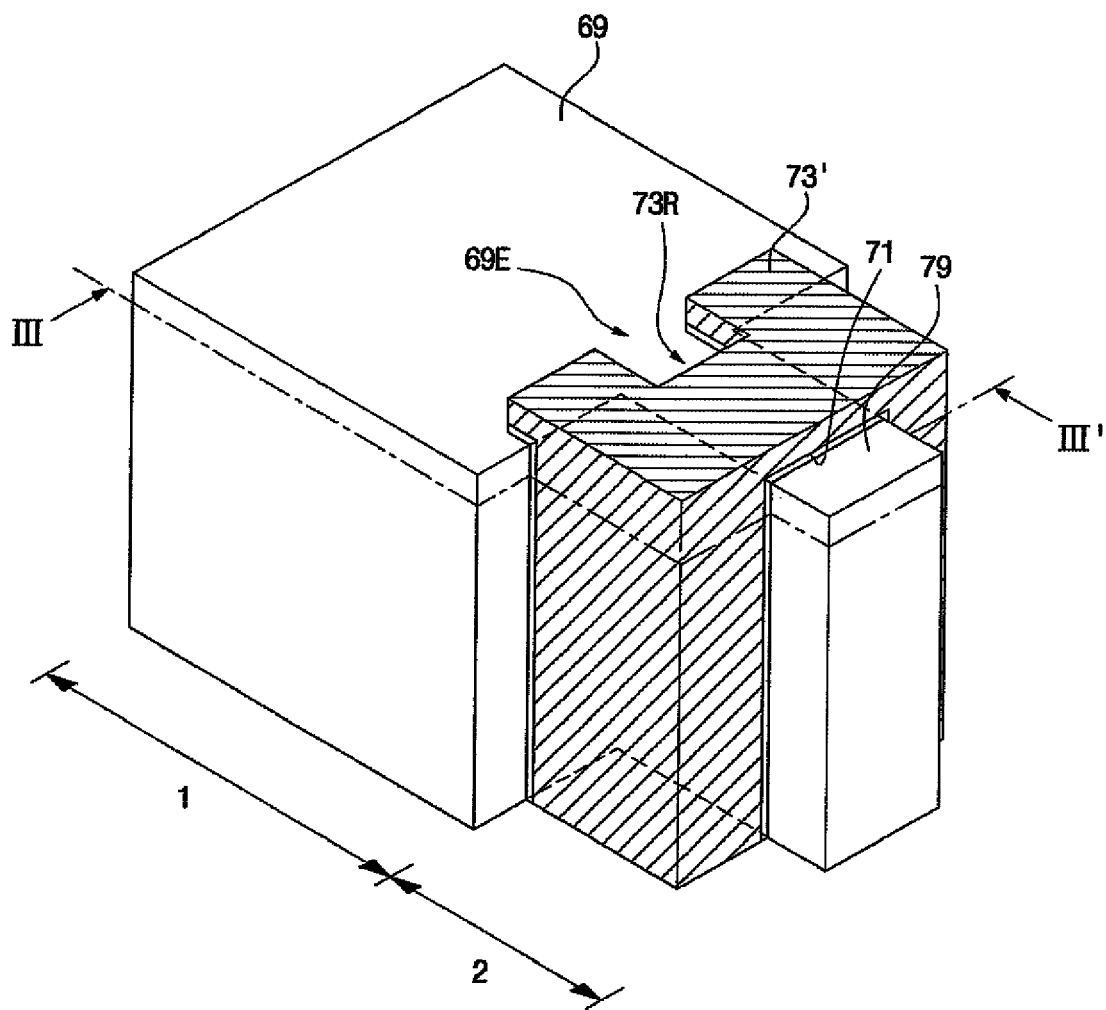
FIG. 7 is a perspective view illustrating important portions of a photodiode, a transfer transistor, and a floating diffusion region.
Figure 8:
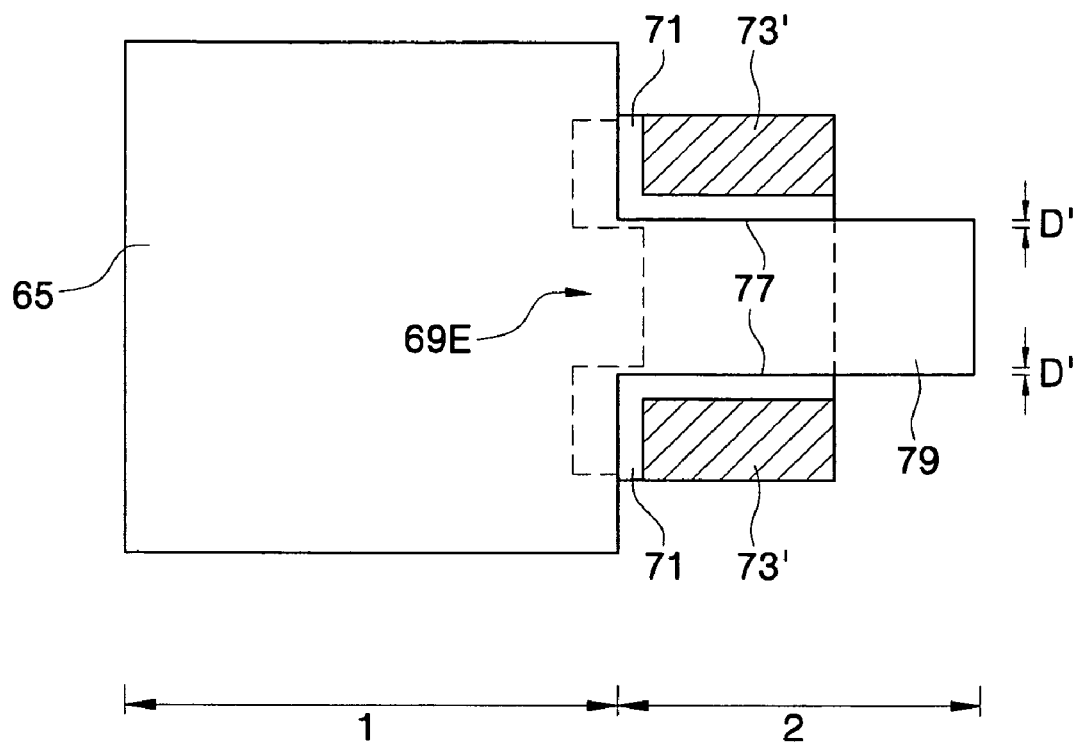
FIG. 8 is a cross-sectional view taken along line III-III' of FIG. 7.

FIG. 5 is a partial plan view illustrating the photodiode PD, the transfer transistor TX, and the floating diffusion region FD of the equivalent circuit diagram of FIG. 4, and FIG. 6 is a cross-sectional view taken along line II-II' of FIG. 5. Further, FIG. 7 is a perspective view illustrating important portions of the photodiode PD, the transfer transistor TX, and the floating diffusion region FD, and FIG. 8 is a cross-sectional view taken along line III-III' of FIG. 7.

Referring to FIGS. 5 through 8, the unit pixel PX1 of the image sensor according to embodiments of the present invention includes an isolation layer 63 disposed in a semiconductor substrate 51. The isolation layer 63 defines a first active region 1 and a second active region 2 extending from the first active region 1 in the semiconductor substrate 51. A shallow p-impurity region 67 is in a portion of the first active region 1. A deep n-impurity region 65 is below the shallow p-impurity region 67. The shallow p-impurity region 67 and the deep n-impurity region 65 define a photodiode (PD) 69. A floating diffusion region (FD) 79 is provided in the second active region 2 at a position spaced apart from the photodiode 69. The floating diffusion region 79 may be a high concentration n-impurity region extended and formed downward from the surface of the second active region 2.

A transfer gate electrode 73' is disposed on the second active region 2 between the photodiode 69 and the floating diffusion region 79. The transfer gate electrode 73' is disposed to cover at least one sidewall 77 of the second active region 2. The transfer gate electrode 73' has a region extending onto the first active region 1 and overlapping the photodiode 69. In addition, the transfer gate electrode 73' may be disposed to cover both sidewalls 77 of the second active region 2. Further, the transfer gate electrode 73' may be disposed to cover both sidewalls 77 and the upper portion of the second active region 2. Also, the transfer gate electrode 73' may have a recessed portion 73R at the upper portion of a region where the first and second active regions 1 and 2 meet each other.

A gate dielectric 71 is interposed between the transfer gate electrode 73' and the active regions 1 and 2. The gate dielectric 71 may further extend to cover the photodiode 69 and the floating diffusion region 79. The deep n-impurity region 65, the transfer gate electrode 73', and the floating diffusion region 79 constitute a transfer transistor TX. In this case, the width of the effective channel of the transfer transistor TX is determined by the width of the portion covered with the transfer gate electrode 73'. That is, with the width of the portion covered with the transfer gate electrode 73' being wider, the width of the effective channel becomes wider.

The photodiode 69 has a protrusion 69E that protrudes into the second active region 2 at the portion meeting the transfer gate electrode 73'. At least any one of the shallow p-impurity region 67 and the deep n-impurity region 65 extends to the protrusion 69E. The protrusion 69E may constitute only the deep n-impurity region 65, or otherwise, constitute the shallow p-impurity region 67 and the deep n-impurity region 65. In addition, the protrusion may have a structure of a "U-shape", a "V-shape" or a "W-shape" in plan view. With the protrusion 69E, a distance D' between both sidewalls 77 of the second active region 2 and the deep n-impurity region 65 may be considerably shortened relative to the prior art. Accordingly, this structure is capable of maximizing transfer efficiency of the photocharges concentrated in the deep n-impurity region 65.

FIGS. 9 through 13 are cross-sectional views taken along line II-II' of FIG. 5, which help explain methods of manufacturing an image sensor according to embodiments of the present invention.

Figure 9:
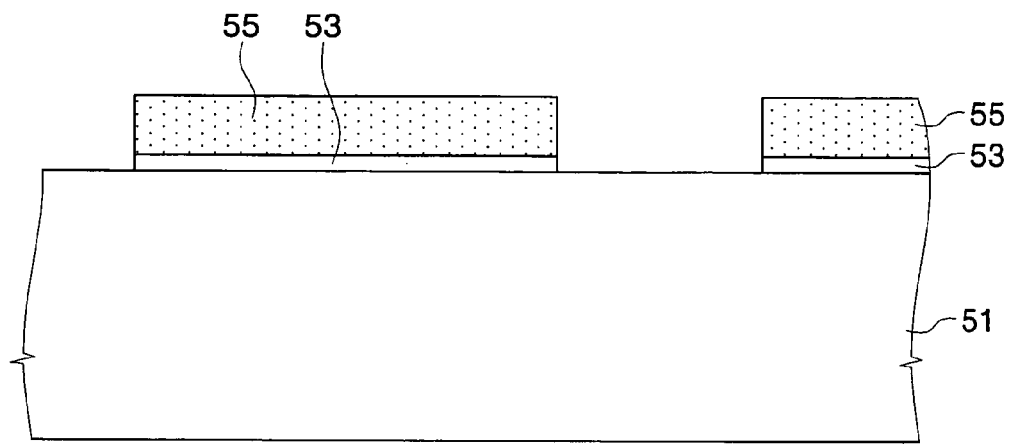
FIGS. 9 through 14 are cross-sectional views taken along line II-II' of FIG. 5, which explain methods of manufacturing an image sensor according the embodiments of the present invention.

Referring to FIGS. 5 and 9, a method of manufacturing an image sensor according to embodiments of the present invention may include forming a pad pattern 53 and a hard mask pattern 55 sequentially deposited on a portion of the semiconductor substrate 51. As for the semiconductor substrate 51, for example, a p-type silicon substrate may be used. The pad pattern 53 can be formed with a silicon oxide by a thermal oxidation method. The hard mask pattern 55 may be preferably formed with a film having an etching selectivity to the semiconductor substrate 51. For example, the hard mask pattern 55 can be formed with silicon nitride (SiN) by a chemical vapor deposition (CVD). The pad pattern 53 functions to release any stress caused by different thermal expansion coefficients between the semiconductor substrate 51 and the hard mask pattern 55.

The operation of forming the pad pattern 53 and the hard mask pattern 55 may include, for example, sequentially forming the silicon oxide and the silicon nitride (SiN) on the semiconductor substrate 51, forming a photoresist pattern on the silicon nitride (SiN), and sequentially etching the silicon oxide and the silicon nitride (SiN) by using the photoresist pattern as an etching mask to expose a portion on the semiconductor substrate 51.

Figure 10:
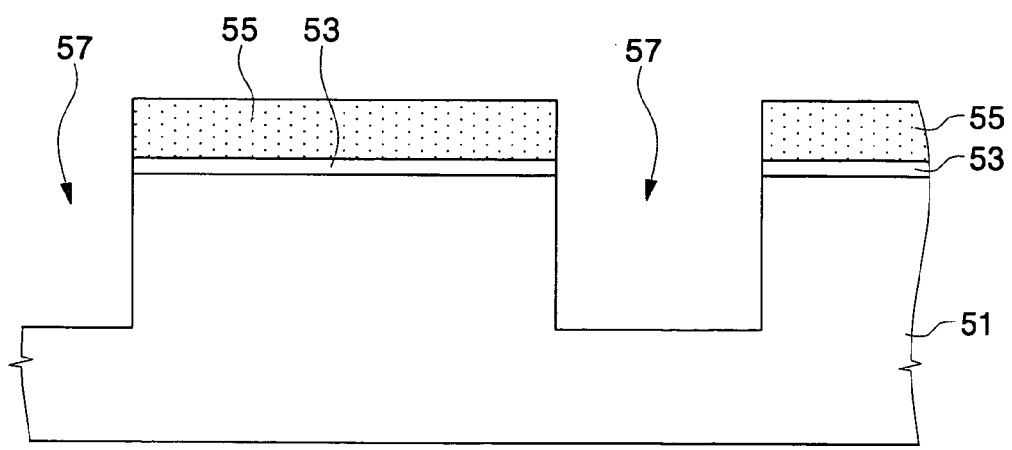

Referring to FIGS. 5 and 10, an isolation trench 57 is formed by selectively etching the semiconductor substrate 51 having the hard mask pattern 55. As a result, the first and second active regions 1 and 2 are defined at a portion of the semiconductor substrate 51. Herein, the second active region 2 is formed to extend from the first active region 1. The active regions 1 and 2 may be formed in a trapezoidal shape or an inverted trapezoidal shape, which, as seen in cross-sectional view, the width of the lower portion is wider than that of the upper portion thereof, and vice versa. However, for simplification of explanation, the shape will be explained as being a rectangular shape in which the upper and lower portions have the same widths as each other.

Figure 11:
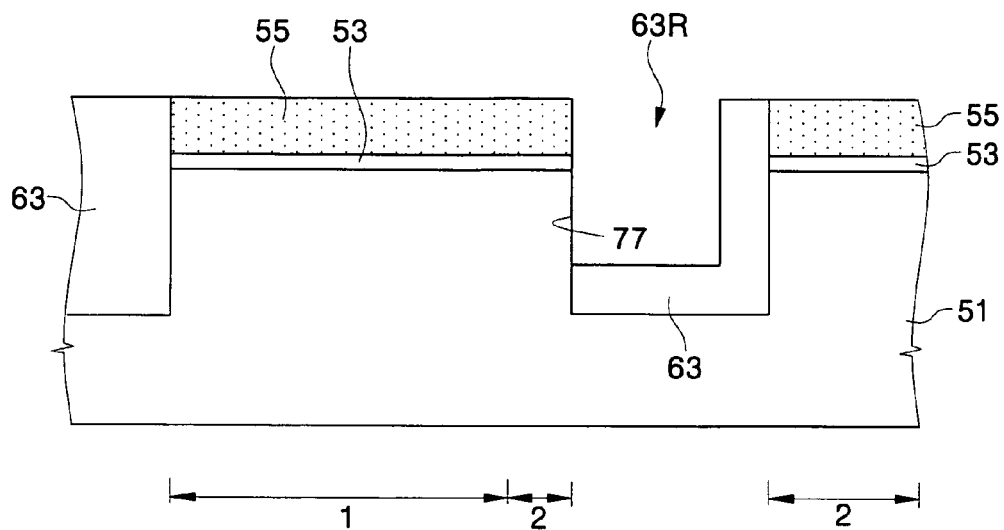

Referring to FIGS. 5 and 11, an isolation layer 63 is formed that fills the isolation trench 57. The isolation layer 63 can be formed with an insulating layer such as a silicon oxide.

For example, a silicon oxide (hereinafter referred to as a 'high density plasma oxide'), using a high density plasma chemical vapor deposition (HDPCVD) method may be formed on the semiconductor substrate 51 having the isolation trench 57. It has been known that the HDPCVD method has an excellent burial feature because it alternatively performs a deposition and an etching repeatedly. The high density plasma oxide may be formed to completely fill the isolation trench 57 and to cover the whole surface of the semiconductor substrate 51. The isolation layer 63 can be formed by the planarization of the high density plasma oxide. As for the planarization, a chemical mechanical polishing (CMP) process may be employed.

As a result, the isolation layer 63 can be formed in the semiconductor substrate 51 to define the first active region 1 and the second active region 2 extending from the first active region 1.

Then, the isolation layer 63 is patterned to form a recessed portion 63R. With the recessed portion 63R, at least one sidewall 77 of the second active region 2 is exposed. In addition, both sidewalls 77 of the second active region 2 can be exposed by the recessed portion 63R.

Specifically, a photoresist pattern (not shown) is formed on the semiconductor substrate 51 having the isolation layer 63. The photoresist pattern is configured to have an opening exposing a portion of the isolation layer 63 and extending across at least one sidewall 77 of the second active region 2. In addition, the opening can be formed to completely extend across both sidewalls 77 of the second active region 2 to thus expose portions of the isolation layer 63. The isolation layer 63 is selectively etched by using the photoresist pattern as an etching mask, forming the recessed portion 63R.

Figure 12:
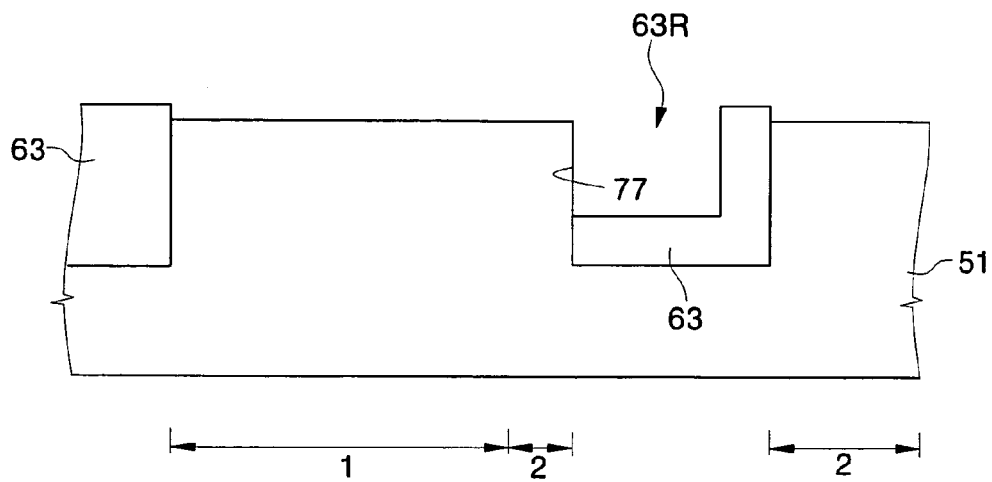

Referring to FIGS. 5 and 12, the hard mask pattern 55 and the pad pattern 53 are removed to expose the first and second active regions 1 and 2.

If the hard mask pattern 55 is formed with silicon nitride (SiN), the hard mask pattern 55 can be removed by using a wet etching solution such as an H3PO4 solution. The pad pattern 53 can be removed by using an oxide etching solution containing HF. On the contrary, the pad pattern 53 can be removed by a dry etching method. If the pad pattern 53 is removed by using the oxide etching solution, the isolation layer 63 may be also etched to thus further expand the recessed portion 63R.

Figure 13:
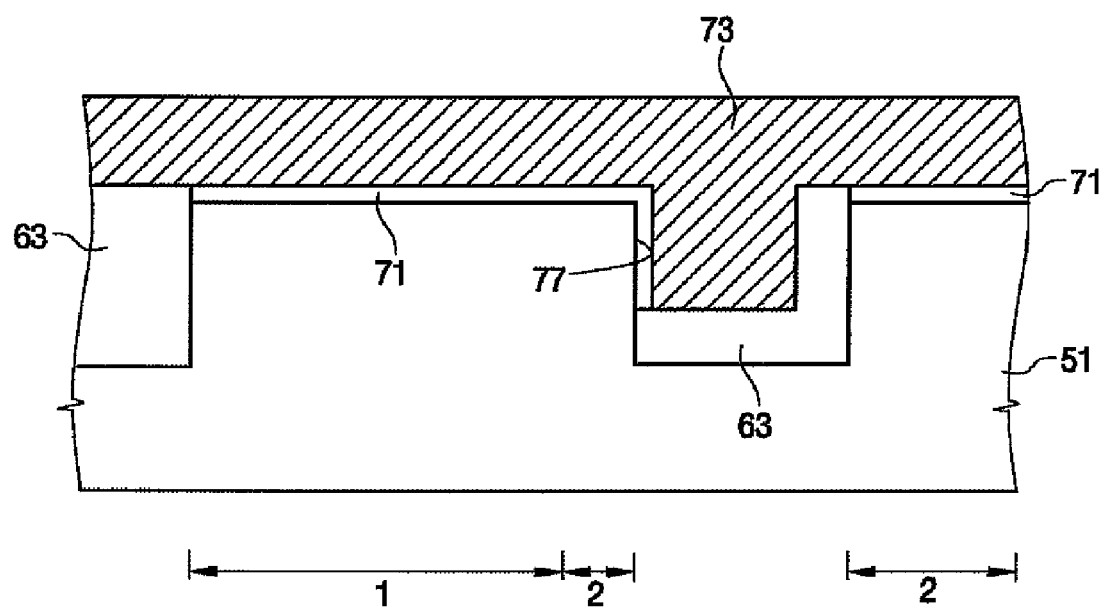

Referring to FIGS. 5 and 13, a gate dielectric 71 is formed on the first and second active regions 1 and 2. The gate dielectric 71 may be formed with silicon oxide by a thermal oxidation method. In this case, the gate dielectric 71 may be also formed at the exposed sidewalls 77 of the second active region 2.

Subsequently, a gate conductive layer 73 is formed on the semiconductor substrate 51 having the gate dielectric 71. The gate conductive layer 73 is formed to fill the recessed portion 63R and to cover the semiconductor substrate 51. The gate conductive layer 73 can be formed with a polysilicon layer.

Other manufacturing methods of the image sensor will now be explained with reference again to FIG. 6.

Figure 14:
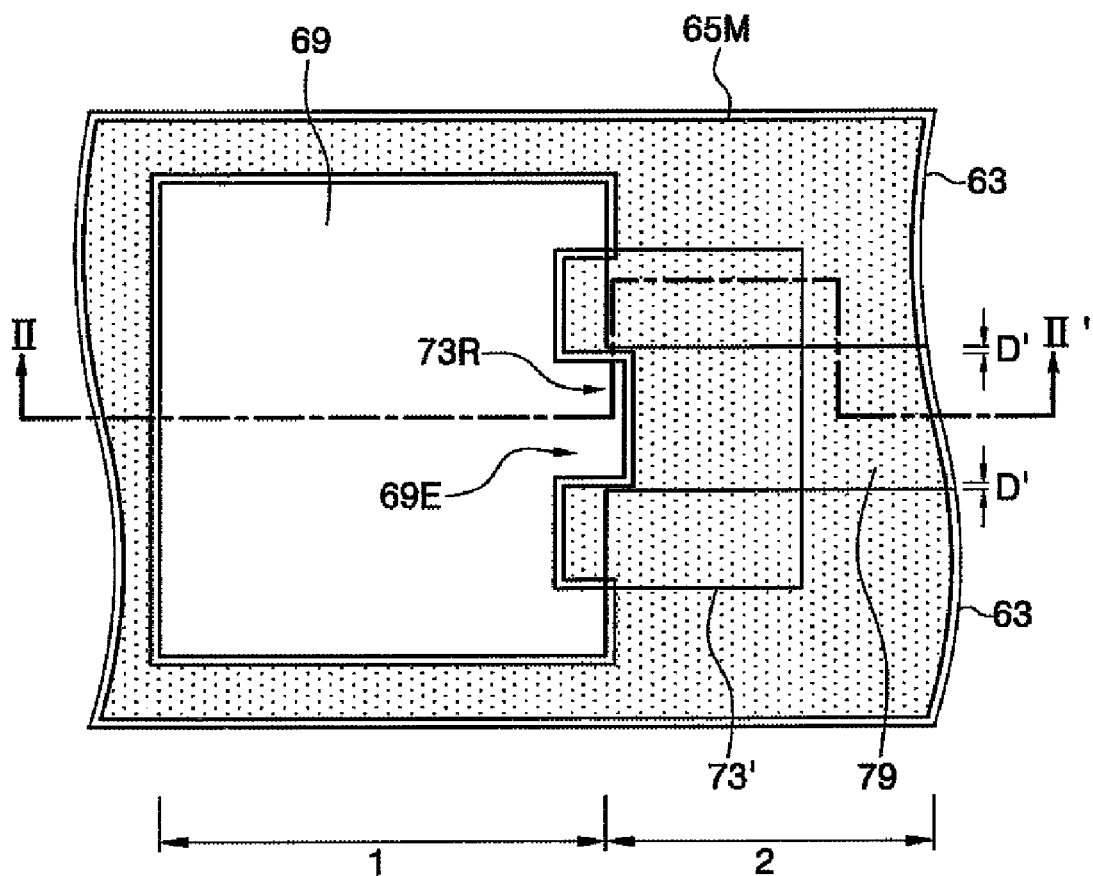

Referring to FIGS. 5, 6 and 14, the transfer gate electrode 73' is formed by patterning the gate conductive layer 73. The transfer gate electrode 73' is formed to cover at least one sidewall 77 of the second active region 2. In addition, if both sidewalls 77 of the second active region 2 are exposed by the recessed portion 63R, the transfer gate electrode 73' can be formed to cover both sidewalls 77 of the second active region 2. Further, if both sidewalls 77 and the upper portion of the second active region 2 are exposed, the transfer gate electrode 73' can be formed to cover both sidewalls 77 and the upper portion of the second active region 2. The transfer gate electrode 73' is extended and formed to cover a partial portion on the first active region 1. The extended portion of the transfer gate electrode covering the first active region 1 is formed to have a recessed portion 73R as seen in plan view. The recessed portion 73R is preferably extended to expose the upper portion of the first active region 1 to the extent that at least a portion of the upper portion of the second active region 2 is exposed. The recessed portion 73R may be formed in a "U-shape", a "V-shape" or a "W-shape" as seen in a plan view.

An n-photodiode photoresist pattern 65M is formed on the semiconductor substrate 51 having the transfer gate electrode 73'. The n-photodiode photoresist pattern 65M is configured to have an opening formed to cover the semiconductor substrate 51 and to expose the first active region 1 and the recessed portion 73R. The deep n-impurity region 65 is formed by implanting n-type impurity ions into the first and second active regions 1 and 2 exposed by the opening by using the n-photodiode photoresist pattern 65M as an ion implantation mask. In addition, the p-impurity region 67 may be formed by implanting the p-type impurity ions into the first and second active regions 1 and 2 exposed by the opening. In the implantation process of p-type impurity ions, the n-photodiode photoresist pattern 65M can be used as an ion implantation mask. On the contrary, the implantation process of p-type impurity ions can be performed after a p-photodiode photoresist pattern (not shown) is separately formed. The ion implantation processes can be performed by using various conditions of energy and angle. The shallow p-impurity region 67 can be formed to be expanded thinly beneath the surface of the first and second active regions 1 and 2. On the contrary, the deep n-impurity region 65 can be formed to be expanded downward from the bottom of the p-impurity region 67. That is, as seen in cross-sectional view, the deep n-impurity region 65 can be formed below the p-impurity region 67. The deep n-impurity region 65 and the shallow p-impurity region 67 constitute a photodiode (PD) 69.

When the deep n-impurity region 65 is formed, the n-type impurity ions are also implanted into the first and second active regions 1 and 2 exposed by the recessed portion 73R. The n-type impurity ions implanted into the recessed portion 73R form a protrusion 69E of the photodiode 69. When the shallow p-impurity region 67 is formed, the p-type impurity ions can be also implanted into the protrusion 69E. On the contrary, by using the p-photodiode photoresist pattern, the p-type impurity ions cannot be implanted into the protrusion 69E. That is, the protrusion 69E can be formed with only n-impurity region 65, or otherwise, also formed with the deep n-impurity region 65 and the shallow p-impurity region 67. In addition, the protrusion 69E can be formed in a "U-shape", a "V-shape" or a "W-shape" as seen in plan view. As a result, the spaced distance D' between the deep n-impurity region 65 and both sidewalls 77 can be considerably shortened relative to the prior art. Accordingly, a unit pixel of the image sensor can be realized that can maximize the transfer efficiency of the photocharges concentrated on the deep n-impurity region 65.

Then, a floating photoresist pattern is formed to expose the second active region 2 at a position spaced apart from the photodiode 69. A floating diffusion region (FD) 79 is formed by implanting the n-type high concentration impurity ions into the exposed second active region 2 by using the floating photoresist pattern as an ion implantation mask. In this case, the floating diffusion region 79 can be formed to have the n-type high concentration impurity region expanded downward from the surface of the second active region 2.

As described before, according to the present invention, the transfer gate electrode is disposed between the photodiode and the floating diffusion region. The transfer gate electrode can be disposed to cover the upper portion and the sidewalls of the second active region. The photodiode includes the protrusion inserted into the second active region at a position meeting the transfer gate electrode. The deep n-impurity region of the photodiode extends into the protrusion. With the protrusion, the spaced distance between both sidewalls of the second active region and the deep n-impurity region can be considerably shortened relative to the prior art. Accordingly, the structure can be realized to maximize the transfer efficiency of the photocharges concentrated on the deep n-impurity region.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation to encompass all such modifications and similar arrangements.

What is claimed is:

1. A method for manufacturing an image sensor, the method comprising:

defining a first active region, a second active region extending from the first active region, and sidewalls of the second active region by forming an isolation layer in a semiconductor substrate;

forming a transfer gate electrode on the second active region, the transfer gate electrode being configured to cover at least one of the sidewalls of the second active region so that a portion of the transfer gate electrode overlaps with the first active region, and to have a recessed portion at a boundary of the first and second active regions, the recessed portion having a recess opening and extending from the recess opening towards the second active region to expose a portion of the second active region, wherein the recessed portion is aligned with a center of the transfer gate electrode;

forming an n-photodiode photoresist pattern on the semiconductor substrate having the transfer gate electrode, wherein the n-photodiode photoresist pattern includes an opening exposing the first active region and the recessed portion; and forming a deep n-impurity region by implanting n-type impurity ions into the first and second active regions by using the n-photodiode photoresist pattern as an ion implantation mask, wherein the deep n-impurity region includes a protrusion disposed in the second active region.

2. The method according to claim 1, wherein the transfer gate electrode is formed to cover both of the sidewalls of the second active region.

3. The method according to claim 1, wherein the transfer gate electrode is formed to cover both of the sidewalls and the upper portion of the second active region.

4. The method according to claim 1, wherein the protrusion is formed in a "U-shape", a "V-shape" or a "W-shape".

5. The method according to claim 1, further comprising, forming a shallow p-impurity region at an upper portion of the deep n-impurity region by implanting p-type impurity ions into the first active region, and forming a floating diffusion region by implanting n-type high concentration impurity ions into the second active region at a position spaced apart from the shallow p-impurity region.

6. The method according to claim 1, wherein the protrusion is self-aligned with the recessed portion of the transfer gate electrode.

7. The method according to claim 1, wherein the protrusion is disposed between the sidewalls of the second active region.

8. The method according to claim 1, wherein a bottom of the transfer gate electrode is lower than a top of the second active region.

9. A method of manufacturing an image sensor, the method comprising:

defining a first active region, a second active region extending from the first active region, and sidewalls of the second active region by forming an isolation layer in a semiconductor substrate;

forming a transfer gate electrode on the second active region, the transfer gate electrode being configured to cover both of the sidewalls of the second active region so that a portion of the transfer gate electrode overlaps with the first active region, and to have a recessed portion at a boundary of the first and second active regions, the recessed portion having a recess opening and extending from the recess opening towards the second active region to expose a portion of the second active region, wherein the recessed portion is aligned with a center of the transfer gate electrode;

forming an n-photodiode photoresist pattern on the semiconductor substrate having the transfer gate electrode, wherein the n-photodiode photoresist pattern includes an opening exposing the first active region and the recessed portion;

forming a deep n-impurity region by implanting n-type impurity ions into the first and second active regions by using the n-photodiode photoresist pattern as an ion implantation mask, wherein the deep n-impurity region includes a protrusion disposed in the second active region;

forming a shallow p-impurity region at an upper portion of the deep n-impurity region by implanting p-type impurity ions into the first active region; and forming a floating diffusion region by implanting n-type high concentration impurity ions into the second active region at a position spaced apart from the shallow p-impurity region.

10. The method according to claim 9, wherein the protrusion is formed in a "U-shape", a "V-shape" or a "W-shape" as seen in plan view.

11. The method according to claim 9, wherein the protrusion is self-aligned with the recessed portion of the transfer gate electrode.

12. The method according to claim 9, wherein the protrusion is disposed between the sidewalls of the second active region.

13. The method according to claim 9, wherein a bottom of the transfer gate electrode is lower than a top of the second active region.

* * * * *